US012606915B2

(12) United States Patent
Choi et al.

(10) Patent No.: US 12,606,915 B2
(45) Date of Patent: Apr. 21, 2026

(54) ROLL-TO-ROLL ATOMIC LAYER DEPOSITION APPARATUS

(71) Applicant: NEXUSBE CO., LTD, Jeonju-si (KR)

(72) Inventors: Hag Young Choi, Yongin-si (KR); Dong Won Kim, Yongin-si (KR); Sang Hun Kim, Gwangju-si (KR); Keun Sik Kim, Yongin-si (KR)

(73) Assignee: NEXUSBE CO., LTD, Jeonju-si (KR)

( * ) Notice: Subject to any disclaimer, the term of this patent is extended or adjusted under 35 U.S.C. 154(b) by 415 days.

(21) Appl. No.: 17/875,379

(22) Filed: Jul. 27, 2022

(65) Prior Publication Data

US 2022/0364237 A1     Nov. 17, 2022

Related U.S. Application Data

(63) Continuation of application No. PCT/KR2021/014852, filed on Oct. 21, 2021.

(30) Foreign Application Priority Data

Feb. 8, 2021     (KR) ........................ 10-2021-0017602
Oct. 14, 2021     (KR) ........................ 10-2021-0136293

(51) Int. Cl.
*C23C 16/54*          (2006.01)
*C23C 16/455*         (2006.01)

(52) U.S. Cl.
CPC ...... *C23C 16/545* (2013.01); *C23C 16/45544* (2013.01)

(58) Field of Classification Search
CPC ........ C23C 16/45551; C23C 16/45544; C23C 16/45574; C23C 16/545
See application file for complete search history.

(56) References Cited

U.S. PATENT DOCUMENTS

2010/0029067 A1*   2/2010   Vijh ...................... C23C 16/545
                                                     118/712
2010/0221426 A1*   9/2010   Sferlazzo ................ C23C 16/46
                                                     118/724
(Continued)

FOREIGN PATENT DOCUMENTS

CN          1647247 A      7/2005
CN        101665923 A      3/2010
              (Continued)

OTHER PUBLICATIONS

Non-final office action mailed Sep. 12, 2023 from the Chinese Patent Office for Chinese Application No. 202111253324.2.
(Continued)

*Primary Examiner* — Joseph A Miller, Jr.

(57)          ABSTRACT

The present disclosure relates to an atomic layer deposition apparatus, and more particularly, to an atomic layer deposition apparatus for depositing an atomic layer on a flexible substrate.

The roll-to-roll atomic layer deposition apparatus according to the embodiment of the present disclosure includes: a casing for providing an inner space that maintains a sealed state; a substrate transfer assembly which is provided in the inner space of the casing and includes a plurality of roll units; and a gas supply assembly for depositing an atomic layer on one surface and a rear surface of a flexible substrate transferred by the substrate transfer assembly, wherein the gas supply assembly includes an upper gas supply module facing the one surface of the substrate, and a lower gas supply module which is spaced apart from the upper gas supply module with the substrate being interposed therebetween and faces the rear surface of the substrate, and the upper gas supply module and the lower gas supply module include at least one purge gas supply unit, at least one
(Continued)

reaction gas supply unit, and at least one source gas supply unit that are disposed along the transfer direction of the substrate.

15 Claims, 6 Drawing Sheets

(56)　　　　　　　References Cited

U.S. PATENT DOCUMENTS

| | | | | |
|---|---|---|---|---|
| 2011/0143019 | A1* | 6/2011 | Mosso | .................... C23C 16/56 |
| | | | | 427/209 |
| 2014/0065307 | A1 | 3/2014 | Lee | |
| 2015/0079271 | A1* | 3/2015 | Hermanns | ............. C23C 16/545 |
| | | | | 427/580 |
| 2016/0340776 | A1* | 11/2016 | Sauer | .................... C23C 16/545 |

FOREIGN PATENT DOCUMENTS

| | | | |
|---|---|---|---|
| CN | 103866288 | A | 6/2014 |
| CN | 104488067 | A | 4/2015 |
| KR | 10-2004-0101479 | A | 12/2004 |
| KR | 10-2014-0032316 | A | 3/2014 |
| KR | 10-2018-0045200 | A | 5/2018 |
| KR | 10-2018-0047802 | A | 5/2018 |
| KR | 10-2018-0115912 | A | 10/2018 |
| KR | 10-2020-0015962 | A | 2/2020 |
| KR | 10-2020-0086883 | A | 7/2020 |
| WO | 2018/190696 | A1 | 10/2018 |
| WO | 2020/036261 | A1 | 2/2020 |

OTHER PUBLICATIONS

International Search Report mailed Jan. 21, 2022 for International Application No. PCT/KR2021/014852.

* cited by examiner

FIG. 4

ROLL-TO-ROLL ATOMIC LAYER DEPOSITION APPARATUS

CROSS-REFERENCE TO RELATED APPLICATIONS

This application is a continuation application of International Application No. PCT/KR2021/014852, filed Oct. 21, 2021, which claims the benefit of Korean Patent Application Nos. 10-2021-0017602, filed Feb. 8, 2021; and 10-2021-0136293, filed Oct. 14, 2021, in the Korean Intellectual Property Office, the disclosures of which are incorporated herein in their entirety by reference.

TECHNICAL FIELD

The present disclosure relates to an atomic layer deposition apparatus, and more particularly, to an atomic layer deposition apparatus for depositing an atomic layer on a flexible substrate.

BACKGROUND ART

In general, a method of depositing a thin film of a predetermined thickness on a substrate such as a semiconductor substrate, glass, or the like includes a physical vapor deposition (PVD) method using physical collision such as sputtering and a chemical vapor deposition (CVD) method using a chemical reaction.

Recently, as the design rule of semiconductor devices is rapidly becoming finer, a thin film with a fine pattern is required, and the step difference in the region where the thin film is formed also becomes very large. Therefore, the use of an atomic layer deposition (ALD) method, which not only can form very uniformly a fine pattern having an atomic layer thickness, but also has excellent step coverage, is increasing.

Such an atomic layer deposition method is similar to a general chemical vapor deposition method in that it uses a chemical reaction between gas molecules. However, unlike a conventional CVD method in which a plurality of gas molecules are simultaneously injected into a process chamber so that a generated reaction product is deposited on a substrate, the atomic layer deposition method has a difference in that a gas containing a single source material is injected into the process chamber to adsorb it on a heated substrate, and then a gas containing another source material is injected into the process chamber so that a product by a chemical reaction between the source materials is deposited on the surface of the substrate.

However, the time-division atomic layer deposition method currently being studied has a problem of low productivity.

SUMMARY OF INVENTION

Technical Problem

A technical problem to be solved by the present disclosure is to provide an atomic layer deposition apparatus that provides a high-quality thin film while ensuring high productivity.

Solution to Problem

A roll-to-roll atomic layer deposition apparatus according to an aspect of an embodiment of the present disclosure includes: a casing for providing an inner space that maintains a sealed state; a substrate transfer assembly which is provided in the inner space of the casing and includes a plurality of roll units; and a gas supply assembly for depositing an atomic layer on one surface and a rear surface of a flexible substrate transferred by the substrate transfer assembly, wherein the gas supply assembly includes an upper gas supply module facing the one surface of the substrate, and a lower gas supply module which is spaced apart from the upper gas supply module with the substrate being interposed therebetween and faces the rear surface of the substrate, and the upper gas supply module and the lower gas supply module include at least one purge gas supply unit, at least one reaction gas supply unit, and at least one source gas supply unit that are disposed along the transfer direction of the substrate.

Further, the inner space of the casing may be formed to have a pressure of greater than 0.5 atm and less than 1.5 atm, and may be filled with 90% or more and less than 100% of an inert gas.

Further, the upper gas supply module and the lower gas supply module may further include a gas supply module body forming an outer shape, a heating unit provided inside the gas supply module body, and a pumping unit for sucking the remaining source gas and reaction gas, pumping flow paths connected to the pumping unit are formed in front and rear of the source gas supply units and the reaction gas supply units respectively based on the transfer direction of the substrate, and the width of the purge gas supply units may be formed to be greater than that of the source gas supply units or the reaction gas supply units based on the transfer direction of the substrate.

Further, the purge gas supply units may include a purge gas supply unit body in which purge gas supply flow paths for supplying an inert gas to the substrate side are formed, a protrusion protruding from an outer surface of the purge gas supply unit body is formed on an end portion of the purge gas supply unit body, and the edge of the protrusion may be formed to be round.

Further, one surface of the protrusion may be formed to face the pumping flow paths.

Further, the purge gas supply unit body is provided as a member separate from the gas supply module body, the source gas supply unit body of the source gas supply units and the reaction gas supply unit body of the reaction gas supply units are formed integrally with the gas supply module body, and the heat transfer efficiency by the heating unit may be greater in the reaction gas supply unit body and the source gas supply unit body than in the purge gas supply unit body.

Further, the heating unit may be embedded in the gas supply module body in a form that surrounds the gas supply units from the outskirt in a state in which the gas supply units are disposed on the gas supply module body.

Further, the distance $h_1$ between the end portion of the purge gas supply flow paths formed in the purge gas supply unit body and the substrate may be formed to be smaller than the distance $h_2$ between the end portion of reaction gas supply flow paths or source gas supply flow paths formed in the reaction gas supply unit body or the source gas supply unit body and the substrate, and the distance $h_2$ between the end portion of the reaction gas supply flow paths or the source gas supply flow paths and the substrate may be formed to be smaller than the distance $h_3$ between the end portion of the pumping flow paths and the substrate.

Further, suction regions may be formed between the purge gas supply unit body and the reaction gas supply unit body or the source gas supply unit body by a negative pressure formed by the pumping flow paths, and the vertical height of the protrusion may be formed to be equal to or smaller than the distance $h_1$ between the end portion of the purge gas supply flow paths and the substrate and the distance $h_2$ between the end portion of the reaction gas supply flow paths or the source gas supply flow paths and the substrate.

Further, the purge gas supply units may be disposed on one side and the other side of the upper gas supply module and the lower gas supply module respectively based on the transfer direction of the substrate, one of the reaction gas supply units may be disposed at a position adjacent to the purge gas supply units disposed on the other side of the upper gas supply module and the lower gas supply module, and one of the source gas supply units may be spaced apart from the one of the reaction gas supply units with the other of the purge gas supply units being interposed therebetween.

Further, the other of the reaction gas supply units may be disposed at a position adjacent to the purge gas supply units disposed on the one side of the upper gas supply module and the lower gas supply module, and the other of the source gas supply units may be spaced apart from the one of the other reaction gas supply units with the another of the purge gas supply units being interposed therebetween.

Further, the purge gas supply units, the reaction gas supply units, and the purge gas supply units may be sequentially disposed between the one of the source gas supply units and the other of the source gas supply units.

Further, when the substrate is moved from one side of the gas supply assembly to the other side thereof, the reaction gas supply units adjacent to one side of the gas supply assembly may be deactivated, and the reaction gas supply units adjacent to the other side of the gas supply assembly may be activated.

Further, at least one purge gas supply unit may be disposed between the purge gas supply units respectively disposed on one side and the other side of the upper gas supply module and the lower gas supply module, and the purge gas supply pressures of the purge gas supply units of the lower gas supply module may be formed to be greater than the purge gas supply pressures of the purge gas supply units of the upper gas supply module.

Further, the purge gas supply pressures of the purge gas supply units respectively disposed on one side and the other side of the upper gas supply module and the lower gas supply module may be formed to be greater than the purge gas supply pressure of the purge gas supply unit between the purge gas supply units respectively disposed on one side and the other side of the upper gas supply module and the lower gas supply module.

Advantageous Effects of Invention

According to the proposed embodiment, the atomic layer deposition apparatus that provides a high-quality thin film while ensuring high productivity may be provided.

BRIEF DESCRIPTION OF DRAWINGS

FIG. 4 is a view showing a cross section taken along a line IV-IV of the upper gas supply module of FIG. 2.

BEST MODE FOR CARRYING OUT THE INVENTION

Figure 1:
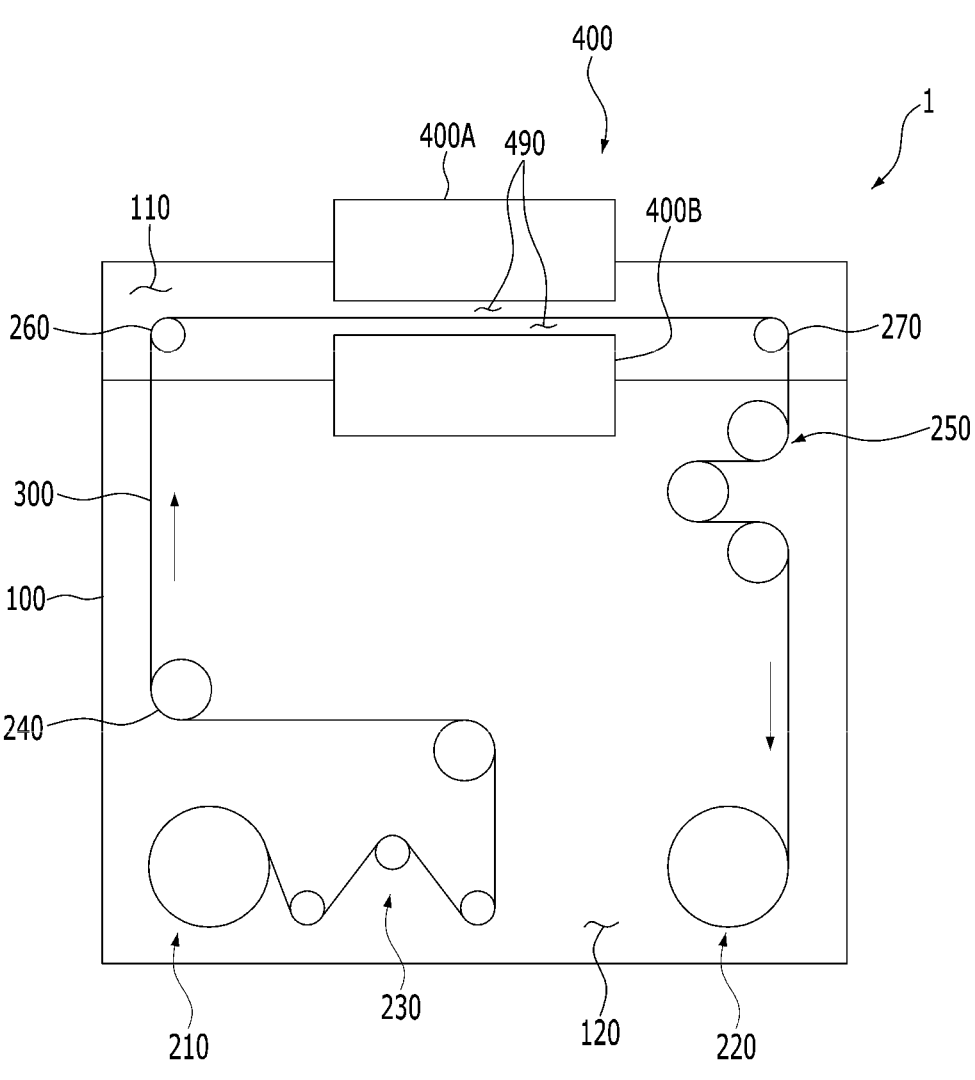
FIG. 1 is a view showing the configuration of a roll-to-roll atomic layer deposition apparatus according to an embodiment of the present disclosure.

Advantages and features of the present disclosure and methods of achieving them will become apparent with reference to the embodiments to be described later in detail in conjunction with the accompanying drawings. However, the present disclosure is not limited to the embodiments disclosed below, but will be embodied in various different forms, and only the present embodiments allow the disclosure of the present disclosure to be complete and are provided to completely inform those of ordinary skill in the art to which the present disclosure pertains of the scope of the invention, and the present disclosure is only defined by the scope of the claims.

Although the first, second, etc. are used to describe various components, it goes without saying that these components are not limited by these terms. These terms are only used to distinguish one component from another. Therefore, it goes without saying that the first component mentioned below may be the second component within the technical spirit of the present disclosure.

The same reference numerals refer to the same components throughout the specification.

The respective features of the various embodiments of the present disclosure can be partially or wholly coupled or combined with each other, and as those skilled in the art will fully understand, technically various interlocking and driving are possible, the respective embodiments can be implemented independently of each other, and it may also be possible to implement them together in a related relationship.

Meanwhile, the potential effects that can be expected by the technical features of the present disclosure that are not specifically mentioned in the specification of the present disclosure are treated as described in the present specification, and the present embodiment is provided to those of ordinary skill in the art to more completely explain the present disclosure, and the contents shown in the drawings may be exaggeratively expressed compared to the implementation appearance of the actual invention, and the detailed description of the configuration determined to unnecessarily obscure the gist of the present disclosure is omitted or simply described.

Hereinafter, embodiments of the present disclosure will be described in detail with reference to the accompanying drawings.

FIG. 1 is a view showing the configuration of a roll-to-roll atomic layer deposition apparatus according to an embodiment of the present disclosure.

Referring to FIG. 1, in the roll-to-roll atomic layer deposition apparatus 1 according to an embodiment of the present disclosure, a substrate 300 made of a flexible material allows a space-division type atomic layer deposition process to be performed while it is moving to a source-purge process space and a reaction-purge space by a substrate transfer assembly 200.

More specifically, the roll-to-roll atomic layer deposition apparatus 1 includes a casing 100 providing the inner spaces 110 and 120 that maintain a sealed state, a substrate transfer assembly 200 which is provided in the inner spaces 110 and 120 of the casing 100 and includes a plurality of roll units 210, 220, 230, 260, and 270, and gas supply assemblies 400A and 400B which deposit an atomic layer on one surface and the rear surface of the flexible substrate 300 transferred by the substrate transfer assembly 200.

The inner spaces 110 and 120 of the casing 100 include a first inner space 110 in which an atomic layer is deposited on the substrate 300 and a gas for atomic layer deposition is discharged from the gas supply assemblies 400A and 400B, and a second inner space 120 in which the substrate 300 is wound or unwound by the substrate transfer assembly 200. In this case, the first inner space 110 and the second inner space 120 may be formed in a shape in which they communicate with each other.

Meanwhile, the pressure of the inner spaces 110 and 120 of the casing 100 is formed to be greater than 0.5 atm and less than 1.5 atm, and may be filled with 90% or more and less than 100% of an inert gas. The inert gas may be, for example, argon or nitrogen, and the deposition process is performed at a pressure at which the pressures of the inner spaces 110 and 120 in which the atomic layer deposition is performed are greater than a vacuum state, for example, atmospheric pressure. Accordingly, there is an advantage in that a separate operation or device for creating a vacuum atmosphere is not required so that the operation cost and operation time can be reduced.

Further, a separate inert gas supply configuration and an impurity discharge configuration for injecting the inert gas into the inner spaces 110 and 120 of the casing 100 and discharging impurities to the outside are not provided, the inert gas is supplied to the inner spaces 110 and 120 through the purge gas supply units 430 (see FIG. 3) of the gas supply assemblies 400A and 400B, and the impurities of the inner spaces 110 and 120 are discharged to the outside through the pumping unit 420 so that it is simpler and the cost may be reduced.

During the process of injecting the inert gas into the inner spaces 110 and 120 before the deposition operation process and performing a startup process of discharging the impurities present in the inner spaces 110 and 120 to the outside, the source gas supply and the reaction gas supply from the gas supply assemblies 400A and 400B are maintained in a state that they are blocked.

The substrate 300 is formed of a flexible material, and may be exemplarily provided as a polymer material such as polyimide, a metal material such as thin film aluminum, or a composite material.

Meanwhile, the gas supply assemblies 400A and 400B include an upper gas supply module facing one surface of the substrate 300, and a lower gas supply module spaced apart from the upper gas supply module with the substrate being interposed therebetween and facing the rear surface of the substrate.

Hereinafter, the configuration of the gas supply assembly 400 will be described in more detail.

Figure 2:
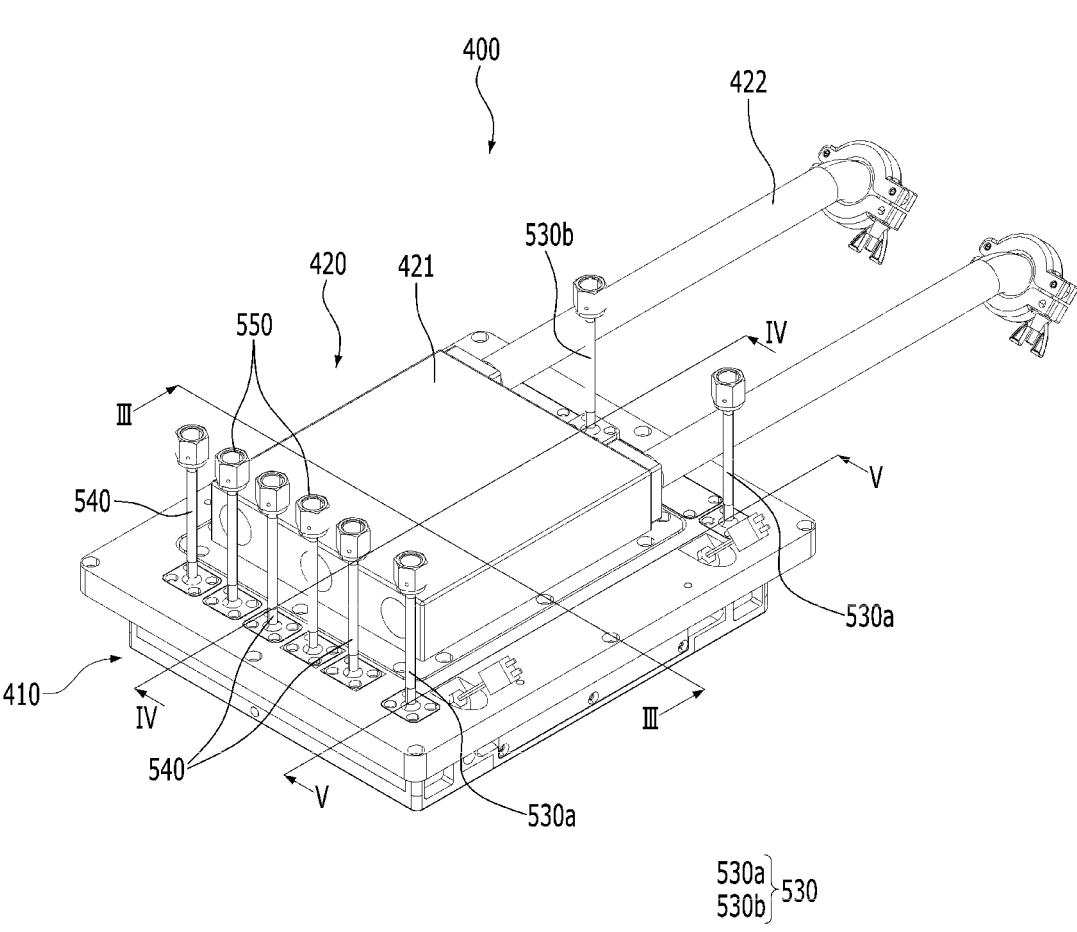
FIG. 2 is a view showing an upper gas supply module of the roll-to-roll atomic layer deposition apparatus of FIG. 1.
Figure 3:
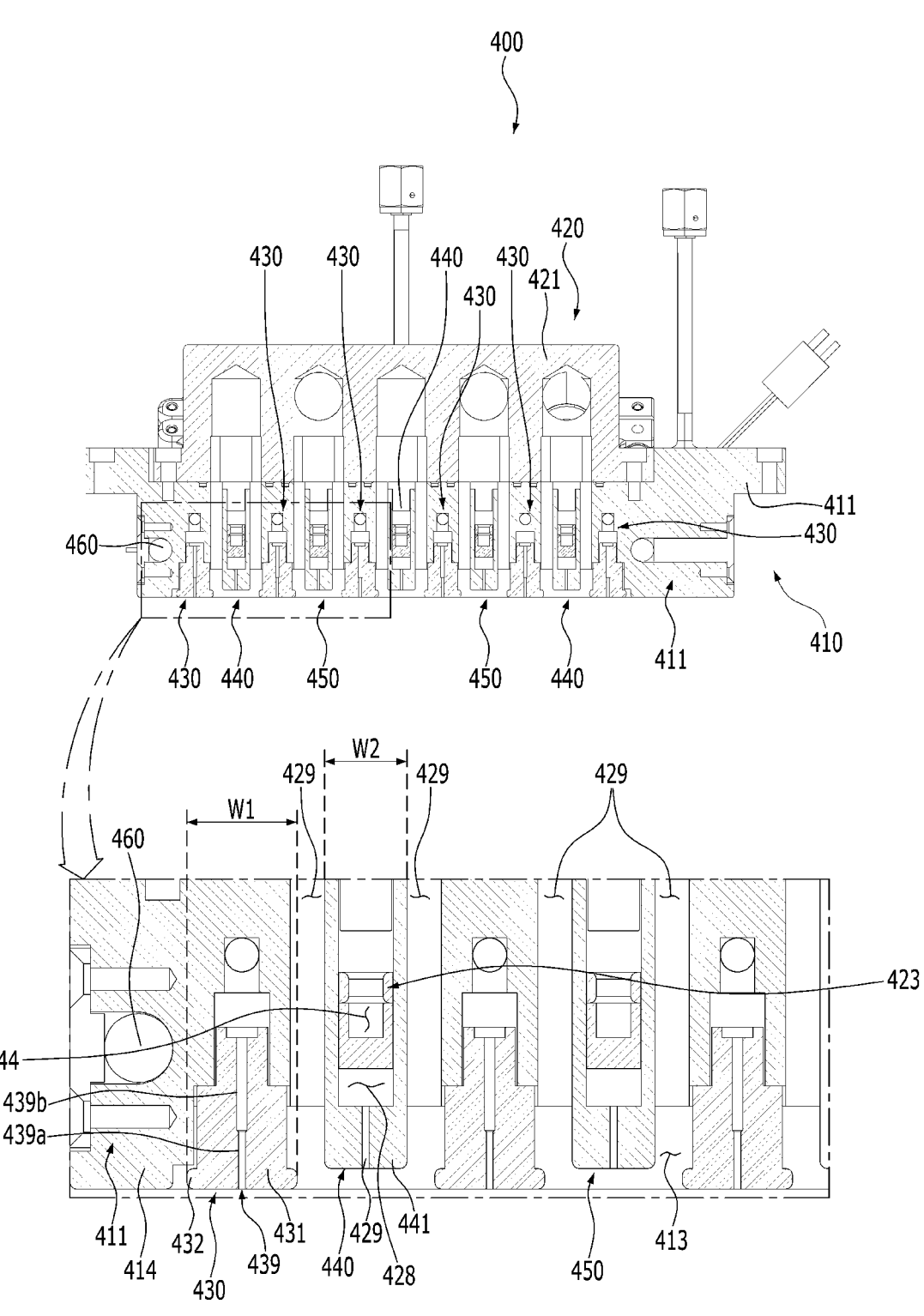
FIG. 3 is a view showing a cross section taken along a line III-III of the upper gas supply module of FIG. 2.
Figure 4:
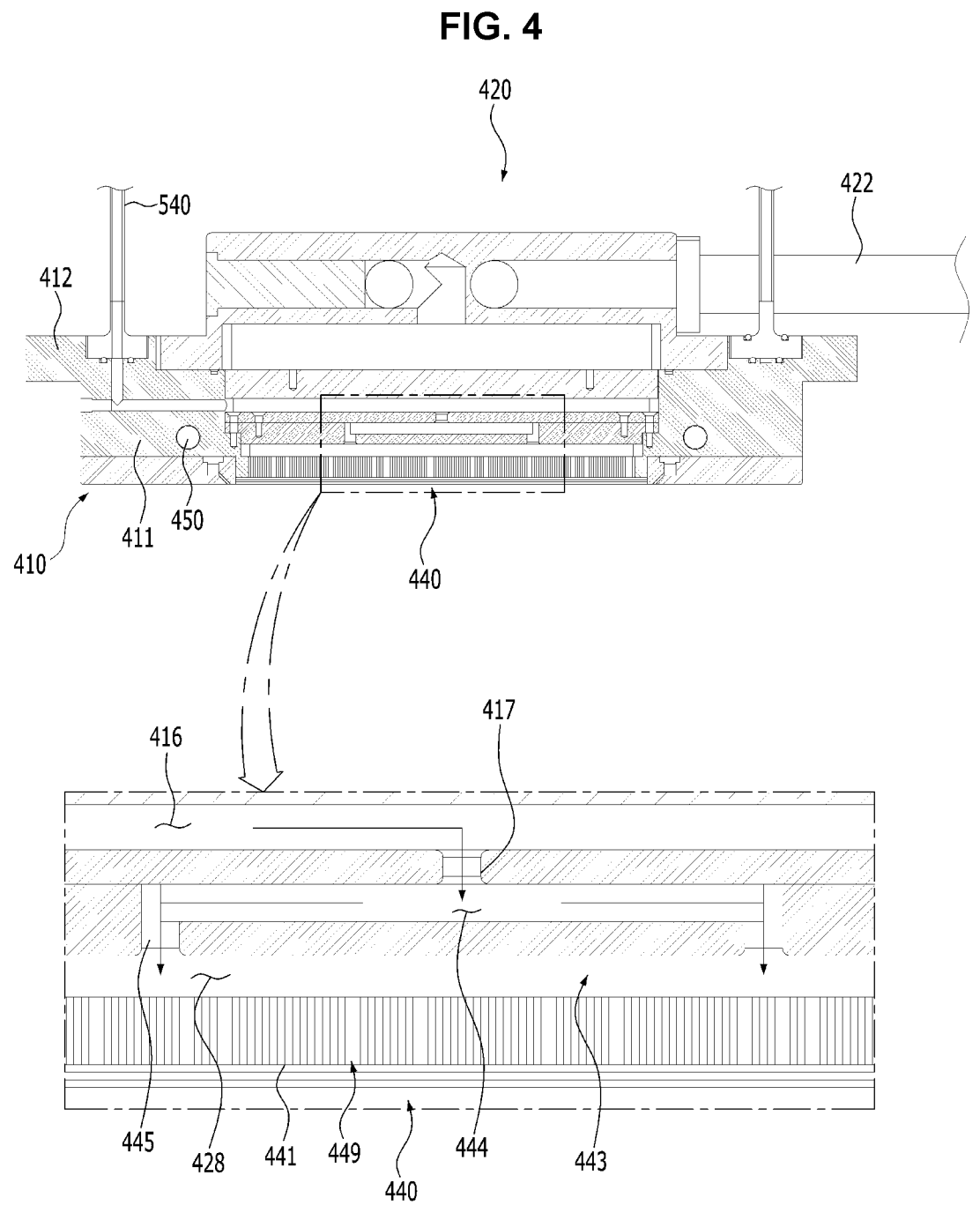
Figure 5:
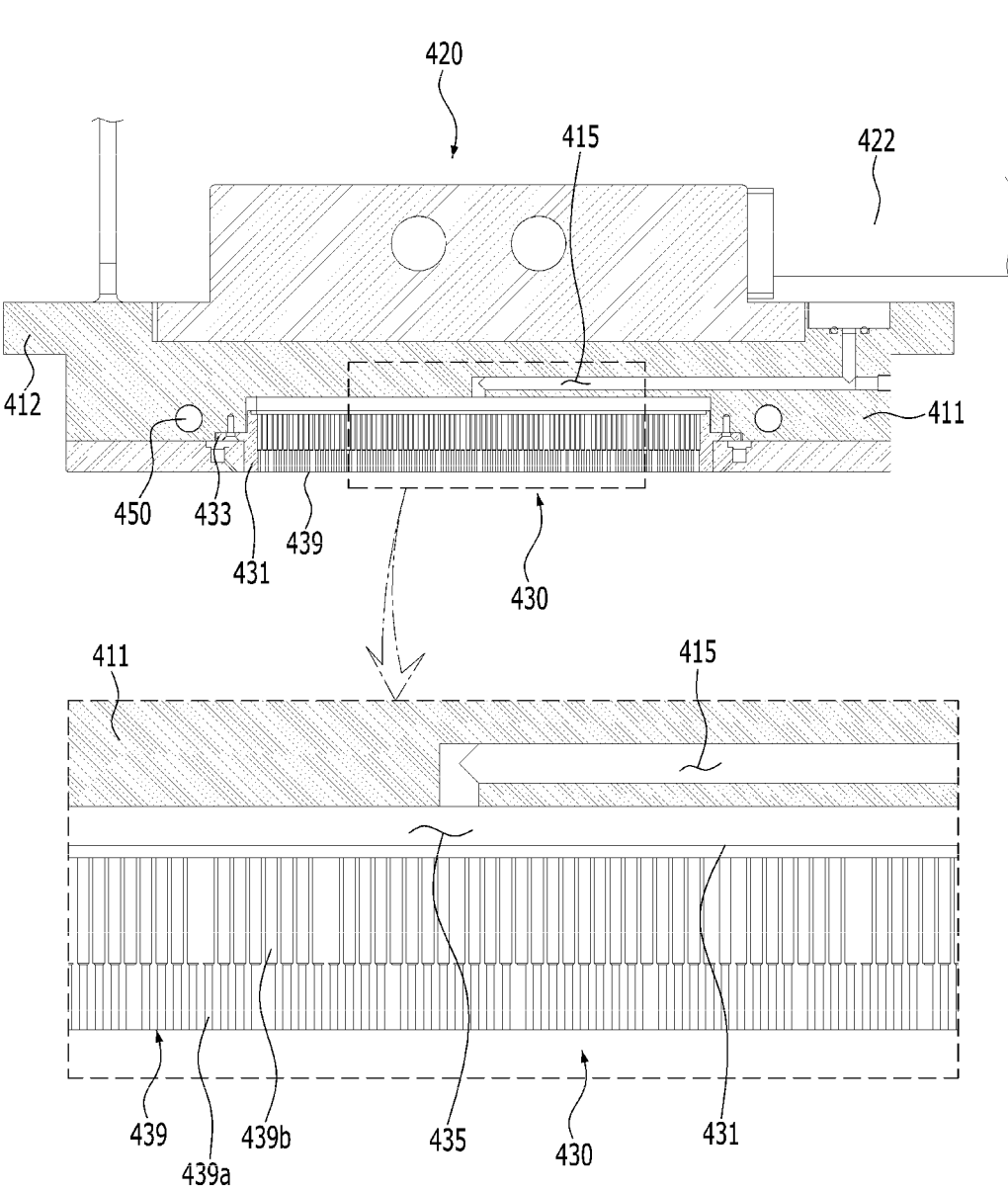
FIG. 5 is a view showing a cross section taken along a line V-V of the upper gas supply module of FIG. 2.

FIG. 2 is a view showing an upper gas supply module of the roll-to-roll atomic layer deposition apparatus of FIG. 1, and FIG. 3 is a view showing a cross section taken along a line III-III of the upper gas supply module of FIG. 2. In addition, FIG. 4 is a view showing a cross section taken along a line IV-IV of the upper gas supply module of FIG. 2, and FIG. 5 is a view showing a cross section taken along a line V-V of the upper gas supply module of FIG. 2.

The upper gas supply module 400A and the lower gas supply module 400B described below differ only in that their mounted positions are symmetrical to each other, and they are substantially the same as each other in other configurations. Therefore, they will be described based on one of the gas supply modules 400.

Referring to FIGS. 2 to 5, the gas supply module 400 includes a gas supply module body 410 forming an outer shape, a heating unit 460 which is provided inside the gas supply module body 410 and provides heat, at least one purge gas supply unit 430 disposed along the transfer direction of a substrate 300, at least one reaction gas supply unit 440 and at least one source gas supply unit 450, and a pumping unit 420 for sucking the remaining source gas and reaction gas.

In more detail, the gas supply module body 410 includes a base portion 411 including a recessed portion 413 which is recessed in one surface and a cover portion 414 which is disposed on one side and the other side of the recessed portion 413 and covers the recessed portion 413, and an extension portion 412 which is disposed at a position adjacent to the rear surface side of the base portion 411 and formed to be further extended outwardly based on the edge of the base portion 411.

The base portion 411 may be exemplarily formed of a metal material having high thermal conductivity, and a pumping unit 420, a purge gas supply port 530, a source gas supply port 550, and a reaction gas supply port 540 are disposed on the other surface of the base portion 411. In addition, a source gas inner flow path and a reaction gas inner flow path 416 and 417 connected to the source gas supply port 550 and the reaction gas supply port 540 respectively, a purge gas inner flow path 415 connected to the purge gas supply port 530, and a pumping inner flow path (not shown) connected to the pumping unit 420 are formed inside the base portion 411.

A through hole (not shown) for passing a fastening member (not shown) for fixing the gas supply module 400 to the roll-to-roll atomic layer deposition apparatus 1 may be formed in the extension portion 412.

The pumping unit 420 includes a pumping unit body 421 fixed to the other side of the base portion 411 and a discharge flow path 422 communicating with the pumping unit body 421 to discharge gas to the outside.

Meanwhile, the purge gas supply units 430 for supplying a purge gas, the reaction gas supply units 440 for supplying the reaction gas, and the source gas supply units 450 for supplying the source gas are disposed in the recessed portion 413 of the gas supply module body 410, and the purge gas supply units 430, the reaction gas supply units 440, and the source gas supply units 450 are alternately disposed according to the transfer direction of the substrate. In addition, pumping flow paths 429 connected to the pumping inner flow path are formed in front and rear of the reaction gas supply units 440 and the source gas supply units 450 respectively based on the transfer direction of the substrate 300 so that the remaining source gas, reaction gas, and purge gas are sucked and discharged to the outside of a deposition space 490 formed between the gas supply module 400 and the substrate 300. In this case, the source gas may be one of trimethylaluminum (TMA), triethylaluminum (TEA), and dimethylaluminum chloride (DMACl), and the reaction gas may be one of oxygen gas and ozone gas. Further, the purge gas may be any one gas of argon (Ar), nitrogen (N2), and helium (He), or a mixed gas of two or more thereof.

The purge gas supply unit 430 includes a purge gas supply unit body 431 in which a purge gas supply flow path 439 for supplying an inert gas to the substrate side is formed. A protrusion 432 protruding from the outer surface of the purge gas supply unit body 431 is formed at an end portion of the purge gas supply unit body 431, and the edge of the protrusion 432 is formed to be round.

Meanwhile, the pumping flow paths 429 are disposed between the purge gas supply units 430 and the source gas supply units 450 or the reaction gas supply units 440 adjacent thereto, and one surface of the protrusion 432 of the purge gas supply units 430 is formed to face the pumping flow paths 429. As the protrusion 432 is formed in such a shape that it protrudes from the outer surface of the purge gas supply unit body 431, mixing of the source gas or the reaction gas of the source gas supply units 450 or the reaction gas supply units 440 disposed between a pair of purge gas supply units 430 can be more effectively suppressed, and the remaining source gas or reaction gas can be more smoothly guided toward the pumping flow paths 429. Further, as the edge of the protrusion 432 is formed to be round, it is possible to prevent a vortex from occurring.

Meanwhile, the purge gas supply unit body 431 is provided as a member separate from the gas supply module body 410, and is fixed to the base portion 411 of the gas supply module body 410.

The purge gas supply flow path 439 formed in the purge gas supply unit body 431 includes a first flow path 439*a* which communicates with the purge gas inner flow path 415 formed in the gas supply module body 410 to discharge the purge gas toward the substrate 300 and is adjacent to the substrate 300 and a second flow path 439*b* which communicates with the first flow path 439*a* and is spaced apart from the substrate 300 with the first flow path 439*a* being interposed therebetween. At this time, the second flow path 439*b* has a larger cross-sectional area than the first flow path 439*a*, and as the first flow path 439*a* has a smaller cross-sectional area than the second flow path 439*b*, a discharge speed of the purge gas discharged from the first flow path 439*a* may be increased.

A purge gas diffusion space 435 communicating with the purge gas inner flow path 415 and communicating with a plurality of purge gas supply flow paths 439 is formed inside the purge gas supply unit body 431. As the purge gas flown in through the purge gas inner flow path 415 is supplied to the purge gas supply flow paths 439 through the purge gas diffusion space 435, the supply pressure of the purge gas through the purge gas supply flow paths 439 may be more uniformly formed.

Meanwhile, the source gas supply unit body of the source gas supply units 450 and the reaction gas supply unit body 441 of the reaction gas supply units 440 are integrally formed with the gas supply module body 410. In this case, the heating unit 460 is embedded in the inside (preferably the cover portion 414) of the gas supply module body 410 in such a form that the gas supply units 430, 440, and 450 are surrounded from the outskirt in a state in which the gas supply units 430, 440, and 450 are disposed on the gas supply module body 410. At this time, the reaction gas supply unit body 441 and the source gas supply unit body manufactured integrally with the gas supply module body 410 are formed to have larger heat transfer efficiency by the heating unit 460 than the purge gas supply unit body 430 that is manufactured and coupled as a member separate from the gas supply module body 410. Accordingly, heat may be more efficiently supplied to the reaction gas and the source gas, thereby increasing the atomic layer deposition efficiency.

Since the source gas supply units 450 and the reaction gas supply units 440 according to the embodiment of the present disclosure are only different in positions where they are to be installed, but are substantially the same in other configurations, hereinafter, the reaction gas supply units 440 will be described with the configuration thereof being focused on.

The reaction gas supply unit 440 includes a reaction gas supply unit body 441 which is integrally formed in the gas supply module body 410 and protrudes from one side of the gas supply module body 410 toward the recessed portion 413, and in which a reaction gas supply flow path 449 is formed, and a gas distribution unit 443 including a horizontal distribution flow path 444 connected to reaction gas inner flow paths 416 and 417 and at least two vertical distribution flow paths 445 formed at different positions and connected to the horizontal distribution flow path 444. A single reaction gas diffusion space 443 is formed between the plurality of vertical distribution flow paths 445 and the plurality of reaction gas supply flow paths 449 so that the supply pressure of the reaction gas may be more uniformly formed.

The reaction gas inner flow paths 416 and 417 include a horizontal inner flow path 416 communicating with the reaction gas supply port 540, and a vertical inner flow path 417 of which one side is connected perpendicularly to the horizontal inner flow path 417, and of which the other side communicates with the horizontal distribution flow path 444.

In addition, one reaction gas supply unit 440 and one source gas supply unit 450 may be connected to one reaction gas supply port 540 and one source gas supply port 550 respectively. In addition, a high-pressure purge gas supply port 530*a* may be connected to each of the pair of purge gas supply units 430 disposed at the outermost side of the purge gas supply units 430, and a low-pressure purge gas supply port 530*b* may be connected to other purge gas supply units 430 so that the pressure of the purge gas may be differentially provided according to positions.

Meanwhile, the width of the purge gas supply units 430 based on the transfer direction of the substrate 300 is formed to be larger than that of the source gas supply units 450 or the reaction gas supply units 440 so that it is possible to increase the densities of the source gas and the reaction gas in a contact region between the substrate 300 and the source gas and the reaction gas, and to prevent mixing between the source gas and the reaction gas.

Figure 6:
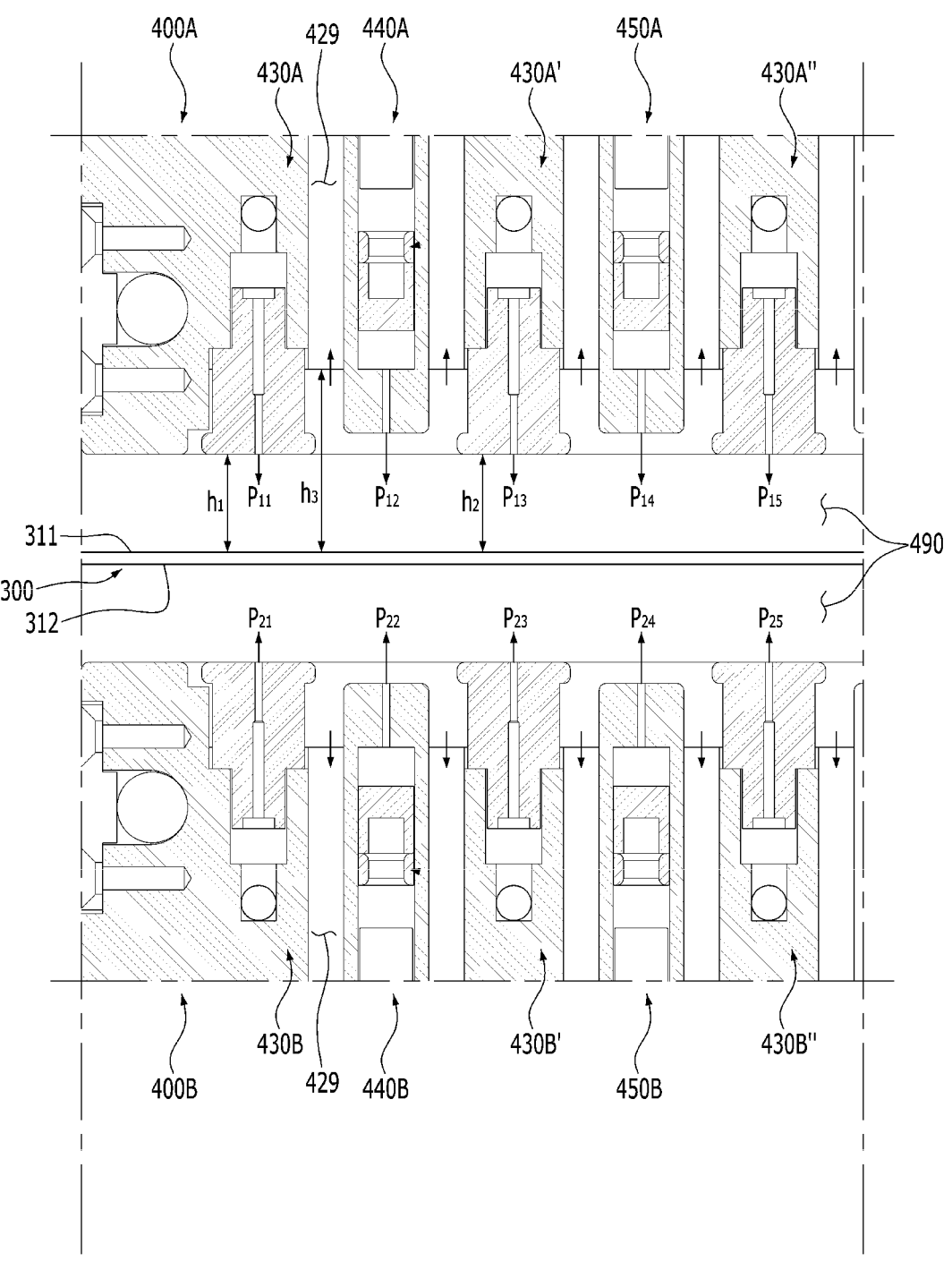
FIG. 6 is a view showing a process in which a substrate passes through a gas supply assembly of the roll-to-roll atomic layer deposition apparatus of FIG. 1.

FIG. 6 is a view showing a process in which a substrate passes through a gas supply assembly of the roll-to-roll atomic layer deposition apparatus of FIG. 1.

Referring to FIG. 6, the gas supply assembly of the roll-to-roll atomic layer deposition apparatus 1 according to an embodiment of the present disclosure includes an upper gas supply module 400A facing the upper surface 311 of a substrate 300, and a lower gas supply module 400B which is spaced apart from the upper gas supply module 400A with the substrate 300 being interposed therebetween and faces the lower surface 312 of the substrate 300.

Gas supply units 430A, 440A, and 450A of the upper gas supply module 400A are disposed to be symmetrical to gas supply units 430B, 440B, and 450B of the lower gas supply module 400B each other. In addition, a space between the upper gas supply module 400A and the upper surface 311 of the substrate 300 and a space between the lower gas supply module 400B and the lower surface 312 of the substrate 300 may be defined as deposition regions.

Meanwhile, in the upper gas supply module 400A and the lower gas supply module 400B according to the embodiment of the present disclosure, the purge gas supply units 430 are each disposed on one side and the other side of the upper gas supply module 400A and the lower gas supply module 400B based on the transfer direction of the substrate 300, and one of the reaction gas supply units 440 is disposed at a position adjacent to the purge gas supply units 430 disposed on the other side of the gas supply module 400. In addition, one of the source gas supply units 450 is spaced apart from the one of the reaction gas supply units 440 with the other of the purge gas supply units being interposed therebetween.

Further, the other of the reaction gas supply units 440 is disposed at a position adjacent to the purge gas supply units 430 disposed on the one side of the upper gas supply module 400A and the lower gas supply module 400B, and the other of the source gas supply units 450 is spaced apart from the one of the reaction gas supply units 440 with the other of the purge gas supply units 430 being interposed therebetween.

In addition, the purge gas supply units 430, the reaction gas supply units 450, and the purge gas supply units 430 are disposed in order between the one of the source gas supply units 450 and the other of the source gas supply units 450.

Illustratively, the gas supply modules 400A and 400B of the atomic layer deposition apparatus 1 according to the present embodiment include three reaction gas supply units 440, two source gas supply units 450, and six purge gas supply units 430. In addition, in the reaction gas supply module 400, a first purge gas supply unit 430, a first reaction gas supply unit 440, a second purge gas supply unit 430, a first source gas supply unit 450, a third purge gas supply unit 430, a second reaction gas supply unit 440, a fourth purge gas supply unit 430, a second source gas supply unit 450, a fifth purge gas supply unit 430, a third reaction gas supply unit 450, and a sixth purge gas supply unit 430 are disposed in order based on the one-directional transfer direction of the substrate 300.

Meanwhile, in the atomic layer deposition process of the roll-to-roll atomic layer deposition apparatus 1 according to the embodiment of the present disclosure, the substrate transfer assembly 200 transfers the substrate 300 in one direction or the other direction, and the source gas or the reaction gas is supplied from the source gas supply units 450 or the reaction gas supply units 440 facing one surface 311 and the rear surface 312 of the substrate 300. In addition, thereby, atomic layer deposition may be performed by alternately and continuously performing adsorption and substitution of molecules contained in the source gas or the reaction gas on one surface 311 and the rear surface 312 of the substrate 300. Meanwhile, a configuration in which the substrate transfer assembly 200 transfers the substrate 300 in only one direction is also included in the embodiment of the present disclosure.

In the present embodiment, two-cycle atomic layer deposition may be performed by two source gas supply units 450 and two reaction gas supply units 440 in the process in which the substrate 300 passes through the upper gas supply module 400A and the lower gas supply module 400B.

At this time, since the source gas is not provided in a state where the molecules of the source gas are adsorbed on the surface of the substrate 300 in the reaction gas supply module 400 that meets first the substrate 300 based on the transfer direction of the substrate 300, the reaction gas of the reaction gas supply module 400 does not contribute to deposition of the atomic layer with respect to the substrate 300 and is discharged to the outside by the pumping unit 410. However, the roll-to-roll atomic layer deposition apparatus 1 according to an embodiment of the present disclosure includes N source gas supply units 450 and N+1 reaction gas supply units 440, thereby enabling N atomic layer deposition cycles to be ensured in a process in which the substrate 300 proceeds in the transfer direction of one direction or the other direction.

In the present embodiment, a configuration in which the source gas and the reaction gas are discharged from all of the source gas supply units 450 and the reaction gas supply units 440 respectively regardless of the transfer direction of the substrate 300 is described, but a configuration of differently controlling the reaction gas supply units 440 depending on the transfer direction of the substrate 300 is also included in the spirit of the present disclosure. In more detail, when the substrate 300 is moved from one side of the gas supply assembly to the other side thereof, the reaction gas supply units 440 adjacent to one side of the gas supply assembly are deactivated, and the reaction gas supply units 440 adjacent to the other side of the gas supply assembly are activated. That is, the discharge of the reaction gas from the reaction gas supply units 440 adjacent to one side and the other side of the gas supply assembly is alternately activated depending on the transfer direction of the substrate 300 so that the efficient supply of the reaction gas may be performed.

Meanwhile, the distance $h_1$ between the end portion of the purge gas supply flow paths 439 formed in the purge gas supply unit body 431 and the substrate 300 is formed to be smaller than the distance $h_2$ between the end portion of the reaction gas supply flow paths 449 and the source gas supply flow paths formed in the reaction gas supply unit body 441 and the source gas supply unit body and the substrate 300. In addition, the distance $h_2$ between the end portion of the reaction gas supply flow paths 449 and the source gas supply flow paths and the substrate 300 is formed to be smaller than the distance $h_3$ between the end portion of the pumping flow paths 429 and the substrate.

Suction regions are formed between the purge gas supply unit body 431 and the reaction gas supply unit body 441, and the source gas supply unit body by a negative pressure formed by the pumping flow paths 429. At this time, the vertical height of the protrusion 414 of the purge gas supply units 430 is formed to be equal to or smaller than the distance $h_1$ between the end portion of the purge gas supply flow paths 439 and the substrate 300 and the distance $h_2$ between the end portion of the reaction gas supply flow paths 449 or the source gas supply flow paths and the substrate. One of the suction regions is surrounded by the purge gas supply unit body 431, the reaction gas supply unit body 441 or the source gas supply unit body, and one surface of the protrusion 432, and a space between the protrusion 432 and the reaction gas supply unit body 441 or the source gas supply unit body is opened.

Meanwhile, at least one purge gas supply unit 430 is disposed between the purge gas supply units 430 respectively disposed on one side and the other side of the upper gas supply module 400A and the lower gas supply module 400B. That is, a plurality of purge gas supply units 430 are disposed in the upper gas supply module 400A and the lower gas supply module 400B.

At this time, the purge gas supply pressures $P_{21}$, $P_{23}$, and $P_{25}$ of the purge gas supply units 430 of the lower gas supply module 400B are formed to be greater than the purge gas supply pressures $P_{11}$, $P_{13}$, and $P_{15}$ of the purge gas supply units 430 of the upper gas supply module 400A. Accordingly, when the substrate 300 formed of a flexible material moves between the upper gas supply module 400A and the lower gas supply module 400B without a separate support structure, downward sagging of the substrate 300 may be prevented by the purge gas supply units 430 of the lower gas supply module 400B providing a relatively large pressure.

At this time, differences between the purge gas supply pressures $P_{21}$, $P_{23}$, and $P_{25}$ of the purge gas supply units 430 of the lower gas supply module 400B and the purge gas supply pressures $P_{11}$, $P_{13}$, and $P_{15}$ of the purge gas supply units 430 of the upper gas supply module 400A may be formed in a size corresponding to the weight of the substrate 300 disposed between the upper gas supply module 400A and the lower gas supply module 400B.

Meanwhile, the purge gas supply pressures of the purge gas supply units 430 respectively disposed on one side and the other side of the upper gas supply module 400A and the lower gas supply module 400B are formed to be greater than the purge gas supply pressures of other purge gas supply units 430 between the purge gas supply units 430 respectively disposed on the one side and the other side of the upper gas supply module 400A and the lower gas supply module 400A. That is, the purge gas supply units 430 discharging greater pressures from one side and the other side of the upper gas supply module 400A and the lower gas supply module 400B are provided, thereby making it possible to suppress exposure of the gas in the deposition space 490 between the upper gas supply module 400A and the lower gas supply module 400B to the outside.

Further, the purge gas supply pressures $P_{11}$, $P_{13}$, $P_{15}$, $P_{21}$, $P_{23}$, and $P_{25}$ of the purge gas supply units 430 are formed to be greater than the reaction gas supply pressures $P_{12}$ and $P_{22}$ and the source gas supply pressures $P_{14}$ and $P_{24}$ of the reaction gas supply units 440 and the source gas supply units 450 so that due to the higher purge gas supply pressures $P_{11}$, $P_{13}$, $P_{15}$, $P_{21}$, $P_{23}$, and $P_{25}$, it may be possible to prevent the source gas and the reaction gas from entering other regions beyond the intended regions.

Meanwhile, in the present embodiment, the purge gas supply pressures $P_{11}$ and $P_{21}$ of the purge gas supply units 430A and 430B provided on the outermost side are formed to be greater than the purge gas supply pressures $P_{13}$, $P_{15}$, $P_{23}$, and $P_{25}$ of the purge gas supply units 430A', 430A", 430B', and 430B" provided on the inner side.

Meanwhile, in another embodiment, the purge gas supply pressure $P_{13}$, $P_{15}$, $P_{23}$, and $P_{25}$ of the purge gas supply units 430A', 430A", 430B', and 430B" provided on the inner side are formed to be greater as it goes from the outer side to the inner side, and the purge gas supply pressure of the purge gas supply unit 430 located at the central portion of the gas supply assembly is formed to be the largest among the purge gas supply units 430 disposed on the inner side. Exemplarily, the third purge gas supply pressures $P_{13}$ and $P_{23}$ of the third purge gas supply units 430A" and 430B" disposed on the central side of the gas supply assembly may be formed to be greater than the second purge gas supply pressures $P_{13}$ and $P_{23}$ of the second purge gas supply units 430A' and 430B'. That is, the purge gas supply pressures may be formed in an order of a large pressure to a small pressure, that is, an order of the first purge gas supply pressures P11 and P21, the third purge gas supply pressures P15 and P25, and the second purge gas supply pressures P13 and P23. Therefore, there are advantages in that external diffusion of the source gas and the reaction gas may be suppressed, and sagging of the substrate 300 may be minimized in the central portion of the gas supply assembly where sagging of the substrate 300 occurs in a relatively large amount.

According to the proposed embodiment, the atomic layer deposition apparatus that provides a high-quality thin film while ensuring high productivity may be provided.

Although preferred embodiments of the present disclosure have been described above, the present disclosure is not limited thereto, and they can be modified and implemented into various forms within the scope of the claims, the detailed description of the invention, and the accompanying drawings, and it is natural that these also fall within the scope of the present disclosure.

MODE FOR CARRYING OUT THE INVENTION

Mode for carrying out the invention has been described together in the above best mode for carrying out the invention.

INDUSTRIAL APPLICABILITY

The present disclosure relates to a roll-to-roll atomic layer deposition apparatus, and has repeatability and industrial applicability in a roll-to-roll atomic layer deposition apparatus used in the field of manufacturing electronic components such as semiconductors, displays, and batteries.

The invention claimed is:

1. A roll-to-roll atomic layer deposition apparatus including:

a casing for providing an inner space that maintains a sealed state;

a substrate transfer assembly which is provided in an inner space of the casing and includes a plurality of roll units; and a plurality of gas supply modules for depositing an atomic layer on one surface and a rear surface of a flexible substrate transferred by the substrate transfer assembly, wherein the plurality of gas supply modules includes an upper gas supply module facing the one surface of the substrate, and a lower gas supply module which is spaced apart from the upper gas supply module with the substrate being interposed therebetween and faces the rear surface of the substrate, and the upper gas supply module and the lower gas supply module include at least one purge gas supply unit, at least one reaction gas supply unit, and at least one source gas supply unit that are disposed along the transfer direction of the substrate, wherein the inner space of the casing comprises an upper inner space and a lower inner space, the lower inner space is provided below the upper inner space, and the substrate transfer assembly is configured to transfer the flexible substrate from the lower inner space to the upper inner space, and subsequently transfer the flexible substrate from the upper inner space to the lower inner space, wherein the plurality of roll units comprises an unwinding roll unit for feeding the flexible substrate and a winding roll unit for winding the flexible substrate which is past the plurality of gas supply modules, and the unwinding roll unit and the winding roll unit are disposed in the lower inner space, wherein the upper space and the lower space are formed to be partially communicated, wherein at least one purge gas supply unit is disposed between the purge gas supply units respectively disposed on one side and the other side of the upper gas supply module and the lower gas supply module, and the purge gas supply pressures of the purge gas supply units of the lower gas supply module are formed to be greater than the purge gas supply pressures of the purge gas supply units of the upper gas supply module, wherein the purge gas supply pressures of the purge gas supply units respectively disposed on one side and the other side of the upper gas supply module and the lower gas supply module are formed to be greater than the purge gas supply pressure of the purge gas supply unit between the purge gas supply units respectively disposed on one side and the other side of the upper gas supply module and the lower gas supply module.

2. The roll-to-roll atomic layer deposition apparatus of claim 1, wherein the inner space of the casing is formed to have a pressure of greater than 0.5 atm and less than 1.5 atm, and is filled with 90% or more and less than 100% of an inert gas.

3. The roll-to-roll atomic layer deposition apparatus of claim 1, wherein the upper gas supply module and the lower gas supply module further include a gas supply module body forming an outer shape, a heating unit provided inside the gas supply module body, and a pumping unit for sucking the remaining source gas and reaction gas, pumping flow paths connected to the pumping unit are formed in front and rear of the source gas supply units and the reaction gas supply units respectively based on the transfer direction of the substrate, and the width of the purge gas supply units is formed to be greater than that of the source gas supply units or the reaction gas supply units based on the transfer direction of the substrate.

4. The roll-to-roll atomic layer deposition apparatus of claim 3, wherein the purge gas supply units include a purge gas supply unit body in which purge gas supply flow paths for supplying an inert gas to the substrate side are formed, a protrusion protruding from an outer surface of the purge gas supply unit body is formed on an end portion of the purge gas supply unit body, and the edge of the protrusion is round.

5. The roll-to-roll atomic layer deposition apparatus of claim 4, wherein one surface of the protrusion faces the pumping flow paths.

6. The roll-to-roll atomic layer deposition apparatus of claim 4, wherein the purge gas supply unit body is provided as a member separate from the gas supply module body, the source gas supply unit body of the source gas supply units and the reaction gas supply unit body of the reaction gas supply units are formed integrally with the gas supply module body, and the heat transfer efficiency by the heating unit is greater in the reaction gas supply unit body and the source gas supply unit body than in the purge gas supply unit body.

7. The roll-to-roll atomic layer deposition apparatus of claim 6, wherein the heating unit is embedded in the gas supply module body in a form that surrounds the gas supply units from an outskirt.

8. The roll-to-roll atomic layer deposition apparatus of claim 4, wherein the distance h1 between the end portion of the purge gas supply flow paths formed in the purge gas supply unit body and the substrate is formed to be smaller than the distance h2 between the end portion of the reaction gas supply flow paths or the source gas supply flow paths formed in the reaction gas supply unit body or the source gas supply unit body and the substrate, and the distance h2 between the end portion of the reaction gas supply flow paths or the source gas supply flow paths and the substrate is formed to be smaller than the distance h3 between the end portion of the pumping flow paths and the substrate.

9. The roll-to-roll atomic layer deposition apparatus of claim 8, wherein suction regions are formed between the purge gas supply unit body and the reaction gas supply unit body or the source gas supply unit body by a negative pressure formed by the pumping flow paths, and the vertical height of the protrusion is formed to be equal to or smaller than the distance h1 between the end portion of the purge gas supply flow paths and the substrate and the distance h2 between the end portion of the reaction gas supply flow paths or the source gas supply flow paths and the substrate.

10. The roll-to-roll atomic layer deposition apparatus of claim 3, wherein the purge gas supply units are disposed on one side and the other side of the upper gas supply module and the lower gas supply module respectively based on the transfer direction of the substrate, one of the reaction gas supply units is disposed at a position adjacent to the purge gas supply units disposed on the other side of the upper gas supply module and the lower gas supply module, and one of the source gas supply units is spaced apart from the one of the reaction gas supply units with the other of the purge gas supply units being interposed therebetween.

11. The roll-to-roll atomic layer deposition apparatus of claim 10, wherein the other of the reaction gas supply units is disposed at a position adjacent to the purge gas supply units disposed on the one side of the upper gas supply module and the lower gas supply module, and the other of the source gas supply units is spaced apart from the one of the other reaction gas supply units with the another of the purge gas supply units being interposed therebetween.

12. The roll-to-roll atomic layer deposition apparatus of claim 11, wherein the purge gas supply units, the reaction gas supply units, and the purge gas supply units are sequentially disposed between the one of the source gas supply units and the other of the source gas supply units.

13. The roll-to-roll atomic layer deposition apparatus of claim 11, wherein when the substrate is moved from one side of the plurality of gas supply modules to the other side thereof, the reaction gas supply units adjacent to one side of the plurality of gas supply modules is deactivated, and the reaction gas supply units adjacent to the other side of the plurality of gas supply modules is activated.

14. The roll-to-roll atomic layer deposition apparatus of claim 1, wherein the substrate transfer assembly is further configured to transfer the flexible substrate from the lower inner space to the upper inner space upwardly, subsequently transfer the flexible substrate within the upper inner space horizontally, and subsequently transfer the flexible substrate from the upper inner space to the lower inner space downwardly.

15. The roll-to-roll atomic layer deposition apparatus of claim 14, wherein the substrate transfer assembly is further configured to, in transferring the flexible substrate within the upper inner space horizontally, transfer the flexible substrate between the upper gas supply module and the lower gas supply module.

* * * * *